United States Patent [19]

Kimura et al.

[11] Patent Number: 5,762,865
[45] Date of Patent: Jun. 9, 1998

[54] PYROLYTIC BORON NITRIDE CRUCIBLE

[75] Inventors: Noboru Kimura; Takuma Kushihashi, both of Annaka; Kazuhiro Yamaguchi, Kanra, all of Japan

[73] Assignee: Shin-Etsu Chemical Co., Ltd., Tokyo, Japan

[21] Appl. No.: 794,536

[22] Filed: Feb. 3, 1997

[30] Foreign Application Priority Data

Feb. 15, 1998 [JP] Japan ................................ 8-052324

[51] Int. Cl.⁶ .................................................. C21B 7/04
[52] U.S. Cl. ................................... 266/275; 266/280
[58] Field of Search ................................. 432/156, 263, 432/265; 266/275, 280

[56] References Cited

U.S. PATENT DOCUMENTS

| | | | |
|---|---|---|---|
| 4,690,841 | 9/1987 | Tanji et al. | 432/265 |
| 4,773,852 | 9/1988 | Tanji et al. | 432/263 |
| 4,913,652 | 4/1990 | Tanji et al. | 432/156 |

*Primary Examiner*—Scott Kastler
*Attorney, Agent, or Firm*—Oliff & Berridge, PLC

[57] ABSTRACT

A pyrolytic boron nitride crucible is disclosed which is suitable for producing a single crystal of a semiconductor compound of Group III and V by the LEC method. The crucible comprises a side part and a bottom part. The bottom part has an absorption coefficient of light of wavelengths between 3,700 cm$^{-1}$ and 6,500 cm$^{-1}$ of at most 1.7 and/or the absorption coefficient of light of wavelengths between 3,700 cm$^{-1}$ to 6,500 cm$^{-1}$ of the bottom part is less than that of the side part by at least 0.5. In the crucible, the heat conduction from the bottom part to material melt in the crucible is strengthened, so that the convection flow of the material melt is suppressed and the temperature distribution in the crucible can be easily controlled.

5 Claims, 1 Drawing Sheet 5,762,865

1

PYROLYTIC BORON NITRIDE CRUCIBLE

BACKGROUND OF THE INVENTION

1. Field of the Invention

The present invention relates to a pyrolytic boron nitride crucible. More specifically, the invention relates to a pyrolytic boron nitride crucible which is suitable as a large-sized crucible to be used when a single crystal of a semiconductor compound of Group III and V is grown by a liquid-enclosed Czochralski method (hereinafter, referred to as the LEC method).

2. Description of the Related Art

The LEC method is employed in pulling a single crystal of a semiconductor compound of Group III and V such as, for example, a GaAs or InP single crystal, in order to prevent volatilization of any component element thereof.

This method is carried out, for example, in such an apparatus as shown in FIG. 1. In the apparatus, a carbon susceptor 3 and a crucible 4 are disposed in the middle of a chamber 1 and held by a supporting shaft 2. The supporting shaft 2 is rotatable and vertically movable. In the apparatus, polycrystals as a raw material for producing a single crystal is first charged in the crucible 4 and then, on the polycrystals, an enclosing agent for preventing the volatilization of component elements of polycrystals is placed. Then, the polycrystals and the enclosing agent are heated and melted by, for example, a two-zone heater 7 of carbon which is disposed so as to surround the crucible, to obtain material melt 5 of the polycrystals and melt 6 of the enclosing agent. Subsequently, a seed crystal 9 which is held by a shaft 8 which is rotatable and vertically movable is dipped into the material melt 5 from above, and then the seed crystal 9 is slowly pulled upward with rotating the shaft 8. In such a manner, a purposive rod-shaped single crystal 10 can be grown.

In the LEC method as described above, a quartz crucible has been employed hitherto as a crucible for accommodating material melt and an enclosing agent. However, when the quartz crucible is used, Si, which is one of the components of quartz, is incorporated into a growing single crystal as an impurity. In addition, there is a problem that Si acts as n-type dopant as well as p-type dopant with respect to compound semiconductors of Group III and V. Accordingly, in case where a single crystal of a semiconductor compound of Group III and V is grown in a quartz crucible by the LEC method, a method in which a single crystal is grown with being doped with Cr is usually employed.

However, when a single crystal is grown with being doped with Cr in such a manner, the insulating property of the grown single crystal is lowered so that the crystal is not suitable as a material of wafers for an integrated circuit (IC). Therefore, in order to obtain such wafers of a single crystal of a semiconductor compound of Group III and V as having a high purity and not being doped with any dopant, a pyrolytic boron nitride (PBN) crucible has been recently used as a crucible for producing such a single crystal of a semiconductor compound. In case where the PBN crucible is used, even if the components of the crucible, B and N, are incorporated into a growing single crystal as impurities, they do not reach the level of impurities, that is, does not act as any dopant, so that the electric characteristics of the obtained single crystal of a semiconductor compound of Group III and V are not deteriorated.

However, pyrolytic boron nitride has some properties not suitable for a crucible for producing a single crystal by the LEC method. That is, PBN has a large heat conductivity in the lamination layer surface direction, that is, the face direction, the anisotropy in the face direction is 30 to 70 times that in the thickness direction, and, if a crucible made of PBN is large, it is difficult to control the temperature distribution of the material melt in the crucible.

Furthermore, in the LEC method described above, since a heater is disposed so as to surround a crucible, material melt in the crucible is heated from the side part of the crucible. Therefore, as seen from FIG. 2 which shows a conception view, the upward convection flow of material melt occurs in a peripheral portion of the crucible and the downward convection flow of material melt occurs in a middle portion of the crucible. In this case, if the difference in temperature between the bottom part of the crucible and the side part of the crucible is too large, the above-described convection flow is vigorous, this leading to unstableness of crystal growth and liability to dislocation of a pulling single crystal. In other words, in the LEC method, a heating source is in general placed around the side part of a crucible, so that the side part of the crucible is increased in temperature, but since heat is hard to be conducted from the side part of the crucible to the bottom part thereof, the bottom part of the crucible has relatively low temperatures. Although PBN has a good heat conductivity in the face direction, it is not possible to conduct such amount of heat that the bottom part of the crucible is sufficiently heated, because the thickness of the crucible is relatively thin so that the heat conduction area is small. Therefore, the difference in temperature between the melt in the vicinity of the side part of the crucible and that in the vicinity of the bottom part is large, so that the convection flow is vigorous. Accordingly, in the LEC method, it is necessary to reduce the difference in temperature between the melt in the vicinity of the side part of the crucible and that in the vicinity of the bottom part so as to suppress the convection flow of material melt in the crucible as much as possible and thus to prevent the dislocation of a pulling single crystal.

SUMMARY OF THE INVENTION

The present invention has been accomplished to solve the above-mentioned problems, and it is an object of the invention to provide a pyrolytic boron nitride crucible in which heat conduction from the bottom part of the crucible to the material melt therein is strengthened, whereby the convection flow of the material melt in the crucible is suppressed and the temperature distribution of the material melt therein can be easily controlled, and to improve the ratio of single crystallization (the ratio of the weight of a pulled single crystal to the weight of used material melt) in the production of a single crystal of a semiconductor compound of Group III and V having high purity.

According to the first aspect of the invention, we provide a pyrolytic boron nitride crucible which comprises a side part and a bottom part, the bottom part having an absorption coefficient of light of wavelengths between 3,700 cm$^{-1}$ and 6,500 cm$^{-1}$ of 1.7 or less. If the absorption coefficient of the bottom part of the crucible is lowered as described above, the transmission of radiant light, that is, radiant heat of the bottom part is increased. As a result, the heat conduction from the bottom part of the crucible to the material melt therein is strengthened, so that it is possible to suppress the convection flow of the material melt in the crucible. Therefore, if a single crystal of a semiconductor compound of Group III and V is grown in such a crucible as described above by the LEC method, it is possible to prevent the dislocation of the single crystal.

According to the second aspect of the present invention, we provide a pyrolytic boron nitride crucible which comprises

- a side part having an absorption coefficient of light of wavelengths between 3,700 cm$^{-1}$ and 6,500 cm$^{-1}$, and
- a bottom part having an absorption coefficient of light of wavelengths between 3,700 cm$^{-1}$ and 6,500 cm$^{-1}$,
- the absorption coefficient of the bottom part being less than that of the side part by 0.5 or more.

In case where the absorption coefficient of light of the bottom part is different from that of the side part as described above, the heat conduction from the bottom part to the material melt due to transmission of radiant heat is strengthened, while the radiation heat is easily absorbed by the crucible through the side part. The absorbed heat is easily conducted in a face direction of the crucible due to the anisotropy of PBN as described above, and as a result, the heat absorbed to the side part is easily conducted to the bottom part of the crucible. Therefore, if such a PBN crucible is used, the convection flow of material melt in the crucible is more suppressed and in growing a single crystal of a semiconductor compound of Group III and V by the LEC method, the dislocation of the single crystal is more prevented.

According to the third aspect of the invention, we provide a pyrolytic boron nitride crucible which comprises a side part and a bottom part, the bottom part having an absorption coefficient of light of wavelengths between 4,700 cm$^{-1}$ and 5,700 cm$^{-1}$ of 1.7 or less.

According to the forth aspect of the present invention, we provide a pyrolytic boron nitride crucible which comprises

- a side part having an absorption coefficient of light of wavelengths between 4,700 $^{-1}$ and 5,700 cm$^{-1}$, and
- a bottom part having an absorption coefficient of light of wavelengths between 4,700 $^{-1}$ and 5,700 cm$^{-1}$,
- the absorption coefficient of the bottom part being less than that of the side part by 0.5 or more.

In case where the bottom part or the bottom part and the side part of a pyrolytic boron nitride crucible have such an absorption coefficient(s) of light of wavelengths between 4,700 cm$^{-1}$ and 5,700 cm$^{-1}$, the growth of a single crystal of, in particular, GaAs, by the LEC method can be preferably performed due to the same functions of the crucible as those described above.

The above-described crucible of the invention is preferably used for producing a single crystal of a semiconductor compound of Group III and V by the LEC method. The crucible exhibits the advantages particularly when the crucible of the invention is used for producing a single crystal of a semiconductor compound of Group III and V by the LEC method, because PBN does not reach the level of impurities in the single crystal.

The crucible of the invention described above has a bottom part having good transmittance of radiant heat. Therefore, it is easy to control temperatures of material melt in the crucible and it is possible to suppress the convection flow of the material melt. Accordingly, when the crucible is used for the production of a single crystal of a semiconductor compound of Group III and V by the LEC method, the ratio of single crystallization can be improved and the production efficiency can be remarkably increased.

DESCRIPTION OF THE PREFERRED EMBODIMENT

Figure 1:
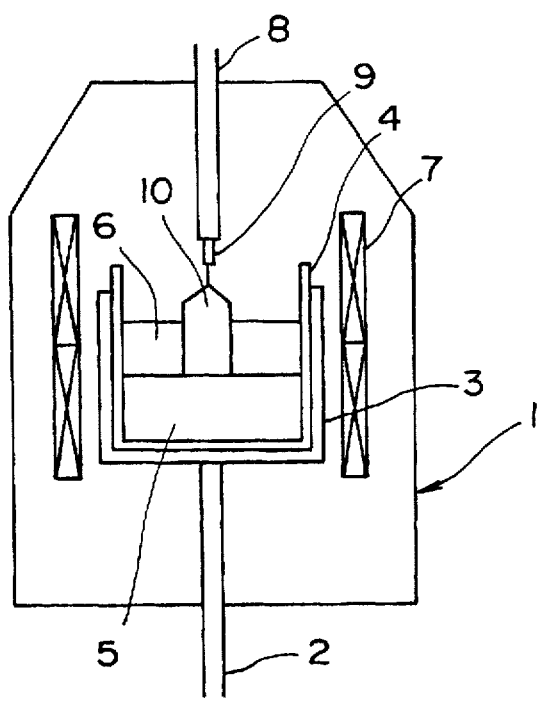
FIG. 1 is a schematic sectional view of an apparatus for the LEC method.
Figure 2:
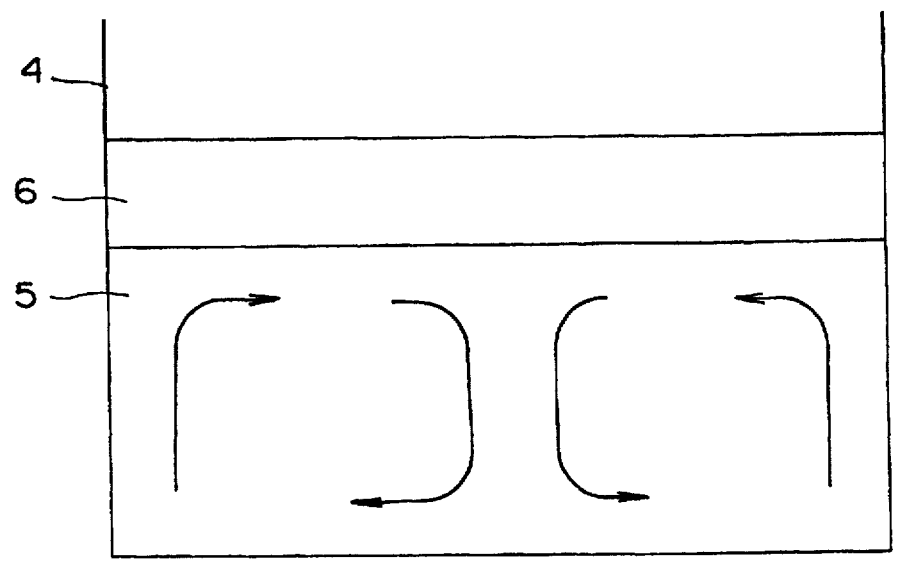
FIG. 2 is a conception view showing a condition of convection flow of material melt in the LEC method.

The present invention will now be described in detail, but is not limited to it.

The present inventors first studied the wavelength of radiant light to be transmitted by the bottom part of a crucible. The temperatures used for a process for producing a single crystal of a semiconductor compound of Group III and V by the LEC method is generally in a range of about 800° to 1,600° C., and then the wavelength at which maximum energy occurs is expressed by the following equation:

$$\lambda_{max}=2,898(\mu m \cdot K)/T \tag{1}$$

wherein T shows an absolute temperature.

In case where T is in a range of 800° to 1,600° C., $\lambda_{max}$ is 3,700 cm$^{-1}$ to 6,500 cm$^{-1}$ according to Equation (1). In particular, in case where a single crystal of a semiconductor compound of Group III and V to be produced is GaAs, the melting point of which is about 1,237° C., $\lambda_{max}$ is in a range of 5,200±500 cm$^{-1}$, that is, 4,700 cm$^{-1}$ to 5,700 cm$^{-1}$.

Therefore, if the absorption coefficient of light of wavelengths between 3,700 and 6,500 cm$^{-1}$, in particular, in case where a single crystal of GaAs is produced, between 4,700 and 5,700 cm$^{-1}$, can be reduced in the bottom part of a crucible, that is, the transmittance thereof can be increased in the bottom part of a crucible, the heat conduction from the bottom part to the material melt in the crucible is improved in the LEC method and as a result the control of the temperature distribution can be improved and the convection flow of the material melt in the crucible can be suppressed, which leads to the improvement of the ratio of single crystallization in the production of a single crystal of a semiconductor compound of Group III and V.

In this case, it is preferable to reduce the absorption coefficient of the bottom part of a crucible and in addition not to reduce the absorption coefficient of the side part of the crucible as much as possible. Concretely, it is advisable that the absorption coefficient of light of wavelengths between 3,700 and 6,500 cm$^{-1}$, in particular, between 4,700 and 5,700 cm$^{-1}$, of the bottom part of a crucible is less than that of the side part by 0.5 or more, preferably, 1.0 or more. In such a crucible, the heat conduction from the bottom part to the material melt due to transmission of the radiant heat is improved and, in addition, the crucible easily absorbs the radiant heat from the side part and the absorbed heat is easily conducted in the face direction as a result of the anisotropy of PBN as described above, so that the heat is easily conducted to the bottom part of the crucible. Therefore, if such a PBN crucible is used, the convection flow of the material melt in the crucible can be more suppressed and the control of the temperature distribution of the material melt is more improved. Accordingly, in growing a single crystal of a semiconductor compound of Group III and V by the LEC method in which such a crucible is used, the dislocation of the single crystal can be more certainly prevented.

Regarding the optical characteristics of boron nitride (BN), the band gap (Eg) thereof is reported to be 5.8 eV (cf. Research Paper of Inorganic Materials Institute, 27, 26) and the IR absorption thereof is reported to be 1,380 cm$^{-1}$ and 810 cm$^{-1}$ (cf. D. N. Bose, H. K. Henisch, J. Am. Cer. Soc. 53, 281 (1970)). Accordingly, although BN ought to be transparent with respect to light of wavelengths between 3,700 cm$^{-1}$ and 6,500 cm$^{-1}$ and between 4,700 cm$^{-1}$ and 5,700 cm$^{-1}$, pyrolytic boron nitride (PBN) is opaque due to disorder of the crystal thereof, incorporation of turbostatic crystals, etc. Therefore, PBN absorbs, to some extent, even the light in the above-described range of wavelengths.

PBN conventionally used in the LEC method has high orientation so as to have a density of 2.1 to 2.2, which density is near the theoretical density of 2.25. In case where PBN has such high orientation, the absorption coefficient of about 1.9 or more is measured with respect to the light of wavelengths between 3,700 cm$^{-1}$ and 6,500 cm$^{-1}$. Accordingly, in the present invention, the absorption coefficient of the bottom part of a crucible is reduced compared with the prior art and, in order to efficiently transmit the radiant heat, the absorption coefficient of the bottom part of the crucible is defined as 1.7 or less.

Moreover, in the present invention, the absorption coefficient of the bottom part of a crucible is different from that of the side part. In order that the radiant heat is transmitted by the bottom part and absorbed by the side part and efficiently conducted to the bottom part, the difference of the absorption coefficient between the bottom part and the side part is required to be at least 0.5, preferably, 1.0 or more.

A method for producing a PBN crucible, which comprises a bottom part having a smaller absorption coefficient and a side part having a larger one, will be mentioned.

In general, a PBN crucible is produced by such a method that a product by a chemical vapor deposition (CVD) reaction is evaporated onto a mold (mandrel) of graphite and then separated from the mandrel to obtain a molding of a crucible.

For example, halogenated boron and ammonia are used as raw materials and pyrolytic boron nitride is deposited onto a mandrel of graphite having a desired shape under a pressure of 10 torr or less and at a high temperature of 1600° C. to 2000° C. by a CVD reaction to a desired thickness, and then is cooled to an odinary temperature and freed of the mandrel, and then processed to a final shape to obtain a PBN crucible.

As a result of experimental studies, the inventors found that the transmittance and absorption coefficient of PBN with respect to light of wavelengths between 3,700 cm$^{-1}$ and 6,500 cm$^{-1}$ depend on the conditions of evaporating PBN onto a mandrel by the CVD reaction, in particular the pressure condition.

That is, the inventors found that when the CVD reaction is carried out under a relative high pressure, the density of deposited PBN tends to be lowered, so that the transmittance is increased and the absorption coefficient is reduced, and on the other hand, when the CVD reaction is carried out under a relative low pressure, the result tends to become contrary.

The detailed theory of such a phenomenons is not clear. The inventors suspect that, judging from the fact that when the CVD reaction is carried out under a relative high pressure, the density of deposited PBN tends to be lowered, the deposited PBN is partly vitrified and as a result the transparency is increased with respect to light of wavelengths of 3,700 cm$^{-1}$ and 6,500 cm$^{-1}$.

Utilizing this phenomenon, it is possible to produce a PBN crucible, the absorption coefficient of which is low in the bottom part and is different between the bottom part and the side part.

That is, the production of a PBN crucible is carried out by the CVD reaction under a reduced pressure, concretely, by supplying a material gas while the inside of a reaction container is drawn in by a pump. Accordingly, the inside of the reaction container has, in general, such pressure distribution as the pressure is higher on the side of supplying a material gas and lower on the side of being drawn in by a pump. If the above-described mandrel of graphite is arranged on a CVD reaction so that the portion of the mandrel corresponding to the bottom part of the PBN crucible is positioned on the side of supplying a material gas, that is, the side of higher pressures, and the portion corresponding to the opening end portion of the PBN crucible is positioned on the side of the pump, that is, the side of lower pressures, and the product by the CVD reaction is evaporated onto the mandrel, it is possible to obtain a PBN crucible which has a lower absorption coefficient in the bottom part and a higher one in the side part.

When it is desired that the difference between the absorption coefficient of the bottom part and that of the side part is increased, it is advisable that the pressure difference between the position where the bottom part is formed and that where the side part is formed is increased. In order to realize the increase in difference, it is necessary to increase the pressure loss of the inside of the CVD reaction container and make the incline of pressure distribution steep. This can be easily realized by such methods as being generally performed, for example, adjustments of an amount of a material gas to be supplied and a capacity for exhaust of a pump, installation of a baffle plate in a reaction container so that pressure loss is compulsorily produced.

The invention will be understood more readily with reference to the following examples; however the examples are intended to illustrate the invention and are not to be construed to limit the scope of the invention.

EXAMPLE AND COMPARATIVE EXAMPLE

A mandrel of graphite was disposed in a cylindrical CVD reaction container of graphite so as to in Example the bottom part of a crucible to be produced is on the side for supplying a material gas and in Comparative Example the opening end portion, that is, the side part of a crucible to be produced is on the side for supplying a material gas. The CVD reaction container has a shape of long and narrow cylinder so that the pressure incline in the container is steep.

To the container 2 L/min of boron trichloride and 5 L/min of ammonia are introduced and they were reacted under an average pressure of 2 torr at the center of the container and at a temperature of 1850° C. to produce a PBN crucible of 0.8 to 1.3 mm in thickness and 8 inches in diameter and 180 mm in height. The production was carried out on condition that the side for supplying a material gas has a pressure of about 4 torr and the side for exhausting the gas has a pressure of about 2 torr in the CVD reaction container. After the completion of the reaction, the PBN evaporated onto the mandrel was separated from the mandrel, and then processed to produce a PBN crucible of 8 inches in diameter.

The PBN crucibles obtained in Example and Comparative Example were measured for absorbance A at 3,700 cm$^{-1}$ to 6,500 cm$^{-1}$ at the center of the bottom part, the center of the side part and the opening end portion, and the respective absorption coefficients B were determined by the following formulas (2) and (3). The results are shown in Table 1.

$$\text{Absorbance } (A) = \text{Log}_{10}(I_0/I) \tag{2}$$

in which $I_0$ is an intensity of incident light and $I$ is an intensity of transmitted light, and $$\text{Absorption Coefficient } (B) = A/t \tag{3}$$

in which t represents the thickness of an absorption layer.

TABLE 1

| PBN Crucible | Absorption Coefficient | | |
|---|---|---|---|
| | Center of Bottom Part | Center of Side Part | Opening End Portion |
| Example | 0.8 | 1.9 | 2.0 |
| Comparative Example | 2.2 | 2.0 | 1.9 |

As seen from the results shown in Table 1, regarding the crucible of Example, the absorption coefficient of the bottom part is small and that of the side part is large. Therefore, if the crucible is used in the LEC method, the convection flow of material melt in the crucible will be suppressed by the transmittance of the radiant heat by the side part and the conduction of heat from the side part to the bottom part. In contrast, regarding the crucible of Comparative Example, the absorption coefficients of the bottom part and the side part are both large. Therefore, it will be difficult to control the temperature distribution and conduct heat from the bottom part and so the convection flow of material melt will be vigorous in the crucible of Comparative Example.

Subsequently, 3 inch diameter single crystals of GaAs were actually pulled by the LEC method by using an apparatus shown in FIG. 1 in which the PBN crucible of Example or Comparative Example was used. The results are shown in Table 2. As shown in Table 2, in case where the PBN crucible of Example was used, the ratio of single crystallization attained about 90%. The convection flow of material melt was suppressed so that the single crystals could be extremely stably grown.

On the other hand, in case where the PBN crucible of Comparative Example was used, it was difficult to control the temperature and the convection flow of material melt was vigorous so that the growth of single crystals was extremely unstable and thus the ratio of single crystallization was low.

TABLE 2

| Used PBN Crucible | Number of | | |
|---|---|---|---|
| | Grown Single Crystal | No Dislocated Single Crystal | Dislocated Single Crystal |
| Example | 10 | 9 | 1 |
| Comparative Example | 5 | 1 | 4 |

What is claimed is:

1. A pyrolytic boron nitride crucible comprising a side part and a bottom part, said bottom part having an absorption coefficient of light of wavelengths between 3,700 cm$^{-1}$ and 6,500 cm$^{-1}$ of at most 1.7.

2. A pyrolytic boron nitride crucible comprising a side part having an absorption coefficient of light of wavelengths between 3,700 cm$^{-1}$ and 6,500 cm$^{-1}$, and a bottom part having an absorption coefficient of light of wavelengths between 3,700 cm$^{-1}$ and 6,500 cm$^{-1}$, said absorption coefficient of said bottom part being less than that of said side part by at least 0.5.

3. A pyrolytic boron nitride crucible comprising a side part and a bottom part, said bottom part having an absorption coefficient of light of wavelengths between 4,700 cm$^{-1}$ and 5,700 cm$^{-1}$ of at most 1.7.

4. A pyrolytic boron nitride crucible comprising a side part having an absorption coefficient of light of wavelengths between 4,700 cm$^{-1}$ and 5,700 cm$^{-1}$, and a bottom part having an absorption coefficient of light of wavelengths between 4,700 cm$^{-1}$ and 5,700 cm$^{-1}$, said absorption coefficient of said bottom part being less than that of said side part by at least 0.5.

5. A pyrolytic boron nitride crucible comprising a side part having an absorption coefficient of light of wavelengths between 3,700 cm$^{-1}$ and 6,500 cm$_{-1}$, and a bottom part having an absorption coefficient of light of wavelengths between 3,700 cm$^{-1}$ and 6,500 cm$^{-1}$, said absorption of said bottom part being at most 1.7 and less than that of said side part by at least 0.5.

* * * * *